United States Patent
Lee et al.

(10) Patent No.: US 10,125,292 B2
(45) Date of Patent: Nov. 13, 2018

(54) ADHESIVE FILM AND PRODUCT FOR ENCAPSULATING ORGANIC ELECTRONIC DEVICE USING SAME

(71) Applicant: LG CHEM, LTD., Seoul (KR)

(72) Inventors: Seung Min Lee, Daejeon (KR); Hyun Jee Yoo, Daejeon (KR); Suk Ky Chang, Daejeon (KR); Jung Sup Shim, Daejeon (KR); Yoon Gyung Cho, Daejeon (KR); Kyung Yul Bae, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/519,901

(22) Filed: Oct. 21, 2014

(65) Prior Publication Data

US 2015/0034940 A1 Feb. 5, 2015

Related U.S. Application Data

(63) Continuation of application No. PCT/KR2013/007053, filed on Aug. 5, 2013.

(30) Foreign Application Priority Data

Aug. 3, 2012 (KR) .................. 10-2012-0085428
Aug. 5, 2013 (KR) .................. 10-2013-0092537

(51) Int. Cl.
*H01L 21/00* (2006.01)
*C09J 7/00* (2018.01)
(Continued)

(52) U.S. Cl.
CPC . *C09J 7/00* (2013.01); *C09J 7/10* (2018.01); *H01L 51/5253* (2013.01);
(Continued)

(58) Field of Classification Search
CPC . H01L 51/5246; H01L 51/5259; H01L 21/56; H01L 23/28; H01L 23/295;
(Continued)

(56) References Cited

U.S. PATENT DOCUMENTS 6,833,668 B1 * 12/2004 Yamada .............. H01L 51/5246
313/505
7,531,847 B2 * 5/2009 Shitagaki ............... H05B 33/04
257/100

(Continued)

FOREIGN PATENT DOCUMENTS

JP 2004-335208 11/2004
KR 10-0827535 4/2008
(Continued)

OTHER PUBLICATIONS

International Search Report from PCT/KR2013/007053, dated Oct. 16, 2013.
(Continued)

*Primary Examiner* — Khiem D Nguyen
(74) *Attorney, Agent, or Firm* — Dentons US LLP (57) ABSTRACT

Provided are an adhesive film and an organic electronic device (OED) encapsulation product using the same. As moisture resistance is maintained by preventing traveling of moisture in a matrix resin, moisture or oxygen input to the organic electronic device from an external environment may be effectively prevented, and temporal stability, life span and durability may be enhanced even when a panel of the organic electronic device is formed as a thin film, thereby ensuring long-term reliability.

18 Claims, 1 Drawing Sheet

(51) Int. Cl.
　　　*H01L 51/52*　　　(2006.01)
　　　*C09J 7/10*　　　(2018.01)
　　　*C08K 3/22*　　　(2006.01)
　　　*C09J 163/00*　　　(2006.01)

(52) U.S. Cl.
　　　CPC ............ *H01L 51/5259* (2013.01); *C08K 3/22* (2013.01); *C08K 2003/2206* (2013.01); *C09J 163/00* (2013.01); *C09J 2201/622* (2013.01); *C09J 2203/326* (2013.01); *C09J 2205/102* (2013.01); *C09J 2463/00* (2013.01)

(58) Field of Classification Search
　　　CPC ................ H01L 23/564; H01L 51/5253; H01L 51/5237; H01L 51/524; H01L 2251/556
　　　See application file for complete search history.

(56) References Cited

U.S. PATENT DOCUMENTS

| | | | |
|---|---|---|---|
| 2005/0062174 A1 | 3/2005 | Ingle | |
| 2005/0221035 A1* | 10/2005 | Wyatt | B65D 83/0005 428/35.7 |
| 2011/0024039 A1* | 2/2011 | Campbell | C08G 59/5086 156/330 |
| 2012/0181914 A1* | 7/2012 | Fukuda | B32B 15/08 313/46 |
| 2014/0264302 A1* | 9/2014 | Yoo | H01L 51/5246 257/40 |
| 2014/0346476 A1* | 11/2014 | Yao | H01L 51/5259 257/40 |
| 2015/0155522 A1* | 6/2015 | Kim | H01L 51/5253 257/40 |

FOREIGN PATENT DOCUMENTS

| | | |
|---|---|---|
| KR | 10-2012-0046704 | 5/2012 |
| KR | 10-2012-0055487 | 5/2012 |
| TW | 201231605 A1 | 8/2012 |
| WO | 2012/060621 A2 | 5/2012 |

OTHER PUBLICATIONS

Written Opinion of the ISA from PCT/KR2013/007053, dated Oct. 16, 2013.
Office Action of Japanese Patent Office in Appl'n No. 2015-524197, dated Feb. 8, 2016.
Office Action of Taiwanese Patent Office in Appl'n No. 102127964, dated Nov. 21, 2014.

* cited by examiner

ADHESIVE FILM AND PRODUCT FOR ENCAPSULATING ORGANIC ELECTRONIC DEVICE USING SAME

This application is a Continuation Bypass of International Application No. PCT/KR2013/007053, filed Aug. 5, 2013, and claims the benefit of Korean Application No. 10-2012-0085428, filed on Aug. 3, 2012, and Korean Application No. 10-2013-0092537, filed on Aug. 5, 2013, all of which are hereby incorporated by reference in their entirety for all purposes as if fully set forth herein.

FIELD OF THE INVENTION

The present invention relates to an adhesive film and an encapsulation product of an organic electronic device (OED) using the same.

DISCUSSION OF RELATED ART

An organic electronic device refers to a device including an organic material layer generating exchange of charges using holes and electrons, and may include a photovoltaic device, a rectifier, a transmitter and an organic light emitting diode (OLED).

An organic light emitting diode, which is a representative organic electronic device, consumes less power and has a higher response speed than conventional light sources, and is preferable as a thin display device or light. In addition, the organic light emitting diode has excellent space utilization, and thus is expected to be applied in various fields including all kinds of portable devices, monitors, notebook computers and TVs.

To extend compatibility and use of the organic light emitting diode, the most important problem is durability. Organic materials and metal electrodes included in the organic light emitting diode are very easily oxidized by external factors such as moisture, and a product including the organic light emitting diode is very sensitive to environmental factors. Therefore, there are demands for developing encapsulants which can effectively prevent permeation of moisture, reduce damage to the organic electronic device, and ensure long-term reliability.

SUMMARY OF THE INVENTION

The present invention is directed to providing an adhesive film and an organic electronic device encapsulation product using the same.

In one aspect, the present invention provides an adhesive film encapsulating an organic electronic device including a curable adhesive layer including a curable resin and a moisture absorbent, in which contents of the moisture absorbent and a hydration product of the moisture absorbent satisfy Equation 1.

$$X/X_0 \geq 90 \text{ wt \%} \quad [\text{Equation 1}]$$

In Equation 1, X is a weight of the moisture absorbent, and $X_0$ is a weight of a product produced by hydrogenating the moisture absorbent and water.

In another aspect, the present invention provides an adhesive film having a temporal change in moisture resistance of the adhesive film of less than 1%.

In still another aspect, the present invention provides an encapsulation product of an organic electronic device, which includes a substrate; an organic electronic device formed on the substrate; and the adhesive film encapsulating the organic electronic device that covers an entire surface of the organic electronic device.

EFFECT

Adhesive films according to exemplary embodiments of the present invention can prevent traveling of moisture into a matrix resin and maintain moisture resistance, effectively block moisture or oxygen input to an organic electronic device from an external environment, and ensure long-term reliability due to enhanced temporal stability, lifespan and durability even in formation of an organic electronic device panel in a thin film.

DETAILED DESCRIPTION OF EXEMPLARY EMBODIMENTS

Hereinafter, exemplary embodiments of the present invention will be described in detail. However, the present invention is not limited to the embodiments disclosed below and can be implemented in various forms. The following embodiments are described in order to enable those of ordinary skill in the art to embody and practice the present invention.

An adhesive film according to an exemplary embodiment of the present invention includes a curable adhesive layer including a curable resin and a moisture absorbent, in which contents of the moisture absorbent and a hydration product of the moisture absorbent satisfy Equation 1.

$$X/X_0 \geq 90 \text{ wt \%} \quad [\text{Equation 1}]$$

In Equation 1, X is a weight of the moisture absorbent, and $X_0$ is a weight of a product produced by hydrogenating the moisture absorbent and water.

The term "organic electronic device (OED)" used herein may refer to a product or device having a structure including an organic material layer generating exchange of charges using holes and electrons between a pair of electrodes facing each other, which may be, for example, a photovoltaic device, a rectifier, a transmitter, and an organic light emitting diode, but the present invention is not limited thereto. In one example of the present invention, the organic electronic device may be an organic light emitting diode.

The curable adhesive may be an adhesive that can be maintained in a solid or semi-solid state at room temperature, attach a planar plate without bubbles due to flowability when heat is applied, and firmly fix a target with the adhesive when a curing reaction is terminated.

It is important that the adhesive film ensure long-term reliability in encapsulation of the organic electronic device. A conventional adhesive film, particularly, an adhesive film using a latent curing agent, is stored at approximately 4° C. However, as moisture which may be present in manufacture of an adhesive film, that is, moisture permeated by the adhesive film, is transferred into a matrix during storing to react with a moisture absorbent in an adhesive film according to exemplary embodiments of the present invention while the adhesive film is stored at 0° C. or less, degradation in prevention of moisture can be prevented as the storing period becomes longer than an initial moisture resistance of the adhesive film. This is because the storage temperature of one of the factors to inhibiting the transfer of moisture in the matrix is below 0° C.

Here, the storing temperature of 0° C. or less may be, for example, −10 to −4° C., and reduction in moisture resistance can be prevented when such a storing temperature is maintained. In addition, when the adhesive film is stored at a very low temperature, a tack time for aging at a room temperature becomes longer when applied to encapsulation of the organic electronic device that may be subsequently performed, and thus productivity of the process can be degraded.

In addition, a temporal change in moisture resistance of the adhesive film according to exemplary embodiments of the present invention may be less than 1%. When the temporal change in moisture resistance of the adhesive film is controlled within the above range, a life span of the organic electronic device can be maintained longer, durability can be enhanced, and an interface peeling phenomenon of an organic electronic device panel preventing a drop of an adhesive strength according to excessive moisture absorption can be prevented.

The adhesive film having a temporal change in moisture resistance of the adhesive film of less than 1% satisfies at least one of the following three conditions: a) a temporal change in purity of the moisture absorbent of less than 10 wt %; b) a temporal change in weight increase ratio under a durability condition of a temperature of 85° C. and relative humidity of 85% of less than 0.2%; and c) a temporal change in moisture permeating speed of less than 10%.

The temporal change in purity of the moisture absorbent may be measured by x-ray diffraction (XRD). A metal oxide has a peak corresponding to a characteristic value of each particle, and when the metal oxide is hydrated with moisture by absorption, the particle is changed, thereby decreasing a purity of the metal oxide. For example, calcium oxide (CaO) reacting with moisture during storage becomes calcium hydroxide ($Ca(OH)_2$), and in this case, an intensity of a peak (an area value of a graph) corresponding to a characteristic value of the calcium oxide is decreased. Accordingly, when the change in purity of the moisture absorbent according to a storage time of the adhesive film is 10 wt % or more, moisture in the adhesive film is transferred during storage and reacts with the moisture absorbent, and thus durability of the adhesive film is degraded.

The temporal change in moisture resistance may be measured by a difference in weight increase ratio under durability conditions of the adhesive film according to storage time (a temporal change in weight increase ratio). When the change in moisture resistance of the adhesive film is insignificant, if the adhesive film is left under durability conditions for a predetermined time after storage, a moisture absorbing ability may be excellent, thereby increasing the weight increase ratio of the adhesive film. On the other hand, when the moisture resistance is degraded, even if the adhesive film is left under durability conditions for a predetermined time after storage, the weight increase ratio of the adhesive film becomes lower than that when the moisture resistance is not degraded due to degradation of a moisture absorbing ability. Accordingly, when the temporal change in moisture resistance is at a predetermined level or more, a difference in weight increase ratio of the adhesive film under the durability conditions according to the storage time is increased. The temporal change in weight increase ratio of the adhesive film under the durability conditions of 85° C. and relative humidity of 85% that can provide long-term reliability in encapsulation of the organic electronic device may be less than 0.2%. That is, for example, the weight increase ratio of the adhesive film under the durability conditions according to the storage time decreases to 3.7 to 3.5%. Accordingly, when weight increase ratios of adhesive films having different storage times left under the durability conditions are measured, if the difference in the weight increase ratio is less than 0.2%, the temporal change in the moisture resistance becomes less than 1%. For example, the weight increase ratio may be obtained by calculating an increase ratio with respect to an initial weight by preparing a sample by curing the adhesive film having a thickness of 200 μm and cutting the cured adhesive film into a predetermined size, recording an initial weight of the sample, leaving the sample at 85° C. and relative humidity of 85% for 24 hours, removing moisture from a surface of the sample, and measuring a weight of the sample, and when the difference between the weight increase ratios of the adhesive films having different storage times is calculated, the temporal change in the weight increase ratio may be measured.

In addition, the temporal change in moisture resistance may also be measured by a difference in moisture permeating rate (a temporal change in moisture permeating rate) of the adhesive film under durability conditions according to the storage time. The temporal change may be measured by a calcium test. The moisture permeating rate is measured at 85° C. and relative humidity of 85% by encapsulating the film with coated Ca in the form of a 6 mm bezel. The temporal change in moisture permeating rate may be less than 10%, and when it is 10% or more, moisture is rapidly permeated, thereby degrading moisture resistance, which is a cause of a defect of an organic light emitting diode panel.

The adhesive film may have a viscosity at room temperature of $10^6$ or $10^7$ dyne/$cm^2$ or more. The term "room temperature" used herein may refer to a temperature which is neither increased nor decreased, for example, approximately 15 to 35° C., particularly, approximately 20 to 25° C., and more particularly, approximately 25° C. The viscosity may be measured using an advanced rheometric expansion system (ARES). When the viscosity of a curable adhesive is controlled within the range, high processability in the encapsulation of the organic electronic device can be obtained, and a planar plane can be encapsulated to a uniform thickness. In addition, unlike a liquid adhesive, the curable adhesive can prevent physical or chemical damage to the organic electronic device by drastically reducing problems of contraction and generation of a volatile gas which may be generated by curing of a resin. In the present invention, as long as the adhesive is maintained in a solid or semi-solid state at room temperature, the upper limit of the viscosity is not particularly limited, and for example, in consideration of processability, the viscosity may be controlled within the range of approximately $10^9$ dyne/$cm^2$ or less.

In addition, since the adhesive film has the moisture resistance, and structurally allows the substrate to be adhered to an upper substrate, a manufacturing process is easily performed in the manufacture of a panel of the organic electronic device, the manufacturing process is simple since a separate passivation process can be omitted, and an encapsulation thickness of the organic electronic device is reduced to contribute to formation as a thin film.

In exemplary embodiments of the present invention, a curable resin that can be used may have a water vapor transmission rate (WVTR) in a cured state of 50 g/$m^2$·day or less, and preferably, 30 g/$m^2$·day or less, 20 g/$m^2$·day or less, or 15 g/$m^2$·day or less. The term "cured state of a curable resin" refers to a state converted into a state in which the curable resin has constant components of the moisture absorbent and filler and serves as a structural adhesive when the curable resin is cured or crosslinked by being used alone or by reacting with other components such as a curing agent and then applied to an encapsulant. The WVTR may be measured in a thickness direction of the cured product at 38° C. and relative humidity of 100% after the curable resin is cured and the cured product is formed in a film having a thickness of 80 μm. In addition, the WVTR may be measured according to ASTM F1249.

When the WVTR of the curable resin is controlled within the above range, the permeation of moisture, vapor or oxygen into an encapsulated product of an organic electronic device may be effectively inhibited, and an effect of inducing a moisture reactive absorbent may be exhibited.

As the WVTR in the cured state of the resin is decreased, the encapsulated structure has better performance. The lower limit of the WVTR is not particularly limited.

A specific kind of curable resin that can be used in the present invention is not particularly limited, and for example, may include various heat-curable and photocurable resins which are known in the art. The term "heat-curable resin" refers to a resin that can be cured through application of suitable heat or aging, and the term "photocurable resin" refers to a resin that can be cured by the radiation of electromagnetic waves. In addition, in the category of the electromagnetic waves, particle beams such as microwaves, IR rays, UV rays, X rays and gamma rays, and particle beams such as alpha-particle beams, proton beams, neutron beams and electron beams may be included. As an example of the photocurable resin, a cationic photocurable resin may be used. The cationic photocurable resin refers to a resin that can be cured by cationic polymerization or a cationic curing reaction induced by the radiation of electromagnetic waves. In addition, the curable resin may be a dual curable resin including both heat-curing and photo-curing characteristics.

A specific kind of the curable resin is not particularly limited, as long as the curable resin has the above-described characteristics. For example, a resin that can be cured to exhibit adhesive characteristics may include a resin including at least one heat-curable functional group of a glycidyl group, an isocyanate group, a hydroxyl group, a carboxyl group or an amide group, or at least one functional group that can be cured by the radiation of electromagnetic waves, selected from an epoxide group, a cyclic ether group, a sulfide group, an acetal group and a lactone group. In addition, a specific kind of resin may include an acryl resin, a polyether resin, an isocyanate resin or an epoxy resin, but the present invention is not limited thereto.

As the curable resin, an aromatic or aliphatic, and linear or branched epoxy resin may be used. In one exemplary embodiment of the present invention, an epoxy resin containing at least two functional groups and an epoxy equivalent of 180 to 1,000 g/eq may be used. When the epoxy resin having the above epoxy equivalent is used, the cured product may have effectively maintained characteristics such as adhesive performance and a glass transition temperature. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenol methane epoxy resin, a naphthalene-type epoxy resin, a dicyclopentadiene-type epoxy resin and a dicyclopentadiene-modified phenol-type epoxy resin.

In the present invention, as an example, an epoxy resin including a cyclic structure in a molecular structure may be used, and for example, an epoxy resin including an aromatic group (e.g., a phenyl group) may be used. When the epoxy resin includes an aromatic group, a cured product may have excellent thermal and chemical stabilities and low moisture absorption, thereby enhancing reliability of the encapsulated product of an organic electronic device. The aromatic-group-containing epoxy resin may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin and an alkyl-modified triphenolmethane epoxy resin.

As the epoxy resin, a silane-modified epoxy resin, for example, a silane-modified epoxy resin having an aromatic group, may be used.

As the silane-modified epoxy resin, for example, a reaction product of at least one of the epoxy resins described above, and a silane compound may be used. Here, the silane compound may be a compound represented by Formula 1.

[Formula 1]

In Formula 1, D is a vinyl group, an epoxy group, an amino group, an acryl group, a methacryl group, a mercapto group, an alkoxy group or an isocyanate group, or an alkyl group substituted with at least one of the functional groups described above, X is hydrogen, an alkyl group, a halogen, an alkoxy group, an aryl group, an aryloxy group, an acyloxy group, an alkylthio group or an alkyleneoxythio group, and n is a number of 1 to 3.

In the compound of Formula 1, the functional group "D" may react with a functional group included in an epoxy resin, thereby forming a silane-modified epoxy resin.

For example, when the functional group is an amino group, the amino group may react with an epoxy group of the epoxy resin, thereby forming a "—CH(OH)—CH$_2$—NH—" bond, and thus the silane compound may be introduced into the epoxy group.

In addition, when the functional group "D" is an isocyanate group or an alkoxy group, a silane compound may be introduced by reacting with an epoxy resin including a hydroxyl (OH) group, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

In Formula 1, as the alkyl group, an alkyl group having 1 to 20 carbon atoms, 1 to 16 carbon atoms, 1 to 12 carbon atoms, 1 to 8 carbon atoms, or 1 to 4 carbon atoms may be used. The alkyl group may be a linear, branched or cyclic alkyl group.

In Formula 1, as the halogen atom, fluorine (F), chlorine (Cl), bromine (Br), or iodine (I) may be used.

In addition, in Formula 1, as the alkoxy group, an alkoxy group having 1 to 20 carbon atoms, 1 to 12 carbon atoms, 1 to 8 carbon atoms, or 1 to 4 carbon atoms may be used. The alkoxy group may be a linear, branched or cyclic alkoxy group.

In addition, in Formula 1, the aryl group or the aryl group included in the aryloxy group may include a so-called aralkyl group or arylalkyl group as well as the aryl group. For example, the aryl group may refer to a monovalent residue derived from a compound including at least one benzene ring or a structure in which at least two benzene rings are linked or condensed or a derivative thereof. The aryl group may be, for example, an aryl group having 6 to 25 carbon atoms, 6 to 21 carbon atoms, 6 to 18 carbon atoms, or 6 to 12 carbon atoms. The aryl group may be, for example, a phenyl group, a dichlorophenyl group, a chlorophenyl group, a phenylethyl group, a phenylpropyl group, a benzyl group, a tolyl group, a xylyl group or a naphthyl group, and preferably a phenyl group.

In addition, in Formula 1, the acyloxy group may be an acyloxy group having 1 to 20 carbon atoms, 1 to 16 carbon atoms, or 1 to 12 carbon atoms.

In addition, in Formula 1, the alkylthio group may be an alkylthio group having 1 to 20 carbon atoms, 1 to 16 carbon atoms, 1 to 12 carbon atoms, 1 to 8 carbon atoms, or 1 to 4 carbon atoms, and the alkyleneoxythio group may be an alkyleneoxythio group having 1 to 20 carbon atoms, 1 to 16 carbon atoms, 1 to 12 carbon atoms, 1 to 8 carbon atoms, or 1 to 4 carbon atoms.

The alkyl group, the alkoxy group, the aryl group, the acyloxy group, the alkylthio group or the alkyleneoxythio group may be optionally substituted with at least one substituent. As the substituent, a hydroxyl group, an epoxy group, an alkyl group, an alkenyl group, an alkynyl group, an alkoxy group, an acyl group, a thiol group, an acryloyl group, a methacryloyl group, an aryl group or an isocyanate group may be used, but the present invention is not limited thereto.

In Formula 1, the functional group "D" may be, for example, an alkoxy group, an amino group or an isocyanate group among the above-described functional groups.

In addition, in Formula 1, the functional group "X" may be, for example, at least one, two or more halogen atoms, alkoxy groups, aryloxy groups, acyloxy groups, alkylthio groups, or alkyleneoxythio groups, and preferably alkoxy groups.

The silane-modified epoxy resin may be, for example, an epoxy resin to which a silane compound is introduced in an amount of approximately 0.1 to 10 parts by weight, 0.1 to 9 parts by weight, 0.1 to 8 parts by weight, 0.1 to 7 parts by weight, 0.1 to 6 parts by weight, 0.1 to 5 parts by weight, 0.1 to 4 parts by weight, 0.1 to 3 parts by weight, 0.3 to 2 parts by weight, or 0.5 to 2 parts by weight relative to 100 parts by weight of the epoxy resin. In one example, the epoxy resin into which the silane compound is introduced may be an aromatic epoxy resin. The aromatic epoxy resin may be, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

As described above, when the epoxy resin structurally having a silane group by being modified with a silane is used, adhesiveness of the organic electronic device to a glass substrate or an inorganic substrate material is optimized, and barrier ability or durability and reliability may also be enhanced. A specific kind of the epoxy resin is not particularly limited, and the resin may be easily obtained from, for example, a manufacturer such as Kukdo Chemical Co., Ltd.

In the present invention, the curable resin may also be a styrene-based resin, a polyolefin-based resin, a thermoplastic elastomer, a polyoxyalkylene-based resin, a polyester-based resin, a polyvinyl chloride-based resin, a polycarbonate-based resin, a polyphenylenesulfide-based resin, a mixture of hydrocarbon, a polyamide-based resin, an acrylate-based resin, an epoxy-based resin, a silicon-based resin, a fluorine-based resin, or a mixture thereof.

Here, as the styrene-based resin, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer, or a mixture thereof may be used. As the olefin-based resin, for example, a high density polyethylene-based resin, a low density polyethylene-based resin, a polypropylene-based resin or a mixture thereof may be used. The thermoplastic elastomer may be, for example, an ester-based thermoplastic elastomer, an olefin-based thermoplastic elastomer or a mixture thereof. Among these, a polybutadiene resin or a polyisobutene resin may be used as the olefin-based thermoplastic elastomer. As the polyoxyalkylene-based resin, for example, a polyoxymethylene-based resin, a polyoxyethylene-based resin or a mixture thereof may be used. As the polyester-based resin, for example, a polyethylene terephthalate-based resin, a polybutylene terephthalate-based resin or a mixture thereof may be used. As the polyvinylchloride-based resin, for example, polyvinylidene chloride may be used. As the mixture of hydrocarbon, for example, hexatriacetane or paraffin may be used. As the polyamide-based resin, for example, nylon may be used. As the acrylate-based resin, for example, polybutyl(meth)acrylate may be used. As the epoxy-based resin, for example, a bisphenol-type resin such as a bisphenol A-type resin, a bisphenol F-type resin, a bisphenol S-type resin and a hydration product thereof; a novolac-type resin such as a phenolnovolac-type resin or a cresolnovolac-type resin; a nitrogen-containing cyclic resin such as a triglycidylisocyanurate-type resin or a hydantoin-type resin; an alicyclic resin; an aliphatic resin; an aromatic resin such as a naphthalene-type resin or a biphenyl-type resin; a glycidyl-type resin such as a glycidylether-type resin, a glycidylamine-type resin, or a glycidylester-type resin; a dicyclo-type resin such as a dicyclopentadiene-type resin; an ester type resin; an etherester-type resin; or a mixture thereof may be used. As the silicon-based resin, for example, polydimethylsiloxane may be used. In addition, as the fluorine-based resin, a polytrifluoroethylene resin, a polytetrafluoroethylene resin, a polychlorotrifluoroethylene resin, a polyhexafluoropropylene resin, a polyfluorinated vinylidene, a polyfluorinated vinyl, a polyfluorinated ethylenepropylene or a mixture thereof may be used.

The listed resins may be grafted with, for example, maleic acid anhydride, copolymerized with another one of the listed resins or a monomer for preparing a resin, or modified by another compound. As an example of the compound, a carboxyl-terminal butadiene-acrylonitrile copolymer may be used.

In addition, the listed resins may include at least one functional group or site that can be cured by heat such as a glycidyl group, an isocyanate group, a hydroxyl group, a carboxyl group or an amide group, or at least one functional group or site that can be cured by radiation of active energy beams such as an epoxide group, a cyclic ether group, a sulfide group, an acetal group or a lactone group to exhibit adhesiveness after curing.

In one example, the curable resin may include a polyisobutene resin. The polyisobutene resin may have hydrophobicity, thereby exhibiting a low WVTR and low surface energy. Particularly, as the polyisobutene resin, for example, a homopolymer of an isobutylene monomer; or a copolymer of an isobutylene monomer and a different monomer that can be polymerized therewith may be used. Here, the monomer that can be polymerized with an isobutylene monomer may include, for example, 1-butene, 2-butene, isoprene or butadiene.

The curable adhesive layer includes a moisture absorbent as well as the curable resin. The term "moisture absorbent" may refer to a moisture-reactive absorbent which is a component capable of absorbing or removing moisture or vapor input from an external environment through a chemical reaction.

The moisture absorbent chemically reacts with vapor, moisture or oxygen input to an inside of the adhesive layer to absorb moisture or vapor. A specific kind of the moisture absorbent is not particularly limited, and the moisture absorbent may be one or a mixture of at least two of a metal powder such as alumina, a metal oxide, a metal salt, and phosphorus pentoxide ($P_2O_5$).

Here, a specific example of the metal oxide may be phosphorus pentoxide ($P_2O_5$), lithium oxide ($Li_2O$), sodium oxide ($Na_2O$), barium oxide (BaO), calcium oxide (CaO) or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

The metal oxides may be mixed with the composition in a state in which the moisture absorbent is suitably processed. For example, depending on the kind of organic electronic device to which the adhesive film is to be applied, the adhesive layer may be a thin film having a thickness of 30 µm or less, and in this case, it may be necessary to perform a grinding process on the moisture absorbent. To grind the moisture absorbent, a process with a 3-roll mill, bead mill or ball mill may be used. In addition, when the adhesive film of the present invention is applied to a top-emissive organic electronic device, transmittance of the adhesive layer is very important, and thus it is necessary to decrease the size of the moisture absorbent. Therefore, to be used in such a use, the moisture absorbent is necessarily subjected to a grinding process.

The adhesive layer may include the moisture absorbent at 1 to 100 or 5 to 50 parts by weight relative to 100 parts by weight of the curable resin. When the moisture absorbent is included in the above range, a crack in the film caused by volume expansion caused by a reaction between the moisture absorbent and moisture may be prevented, and physical or chemical damage may be prevented, and long-term reliability of the adhesive film may also be provided.

Unless particularly defined otherwise, the unit "parts by weight" used herein refers to a weight ratio between components.

When the range of a content of the moisture absorbent is controlled as described above, a cured product may exhibit excellent moisture and vapor resistance, and an encapsulation structure of the thin film may be formed, and excellent moisture resistance may be exhibited.

The curable adhesive layer may further include a filler. The filler is a kind of physical moisture absorbent that may extend a traveling path of moisture or vapor that permeates into an encapsulated structure to inhibit the permeation of moisture or vapor, thereby maximizing resistance to moisture and vapor due to a matrix structure of a curable resin and through interaction with the moisture absorbent. A specific kind of filler that can be used in the present invention may be, but is not limited to, one or a mixture of at least two of the group consisting of clay, talc, silica, zeolite, zirconia, titania and montmorillonite.

In addition, to increase binding efficiency between the filler and an organic binder, a product whose surface is treated with an organic material may be used as the filler, or a coupling agent may be further added to the filler.

The curable adhesive layer may include the filler in an amount of 1 to 50 parts by weight or 1 to 20 parts by weight of the filler relative to 100 parts by weight of the curable resin. As the content of the filler is controlled to 1 part by weight or more, a cured product having excellent moisture or vapor resistance and mechanical properties may be provided. In addition, as the content of the filler is controlled to 50 parts by weight or less, a cured product capable of being formed in a film type, and exhibiting moisture resistance even when formed in a thin film, may be provided.

A specific kind of curing agent that can be used is not particularly limited, and may be suitably selected according to the curable resin used or the kind of a functional group included in the resin. For example, when an epoxy resin is used as the curable resin in the present invention, a general curing agent for an epoxy resin known in the art may be used as the curing agent, which may be, but is not limited to, one or a mixture of at least two of amine-based compounds, imidazole-based compounds, phenol-based compounds, phosphorus-based compounds and acid-anhydride-based compounds.

The curable adhesive layer may include the curing agent in an amount of 1 to 20 parts by weight or 1 to 10 parts by weight relative to 100 parts by weight of the curable resin. However, the content is only an example of the present invention. That is, the content of the curing agent may be changed according to the kind and content of the curable resin or functional group, and a matrix structure or crosslinking density to be realized.

In addition, the kind of the initiator that can be used in the present invention, for example, a cationic photopolymerization initiator, is not particularly limited, and a known cationic photopolymerization initiator such as an aromatic diazonium salt, an aromatic iodine aluminum salt, an aromatic sulfonium salt or an iron-arene complex, and preferably, an aromatic sulfonium salt, may be used, but the present invention is not limited thereto.

In this case, for example, a content of the initiator may be included in an amount of 0.01 to 10 parts by weight or 0.1 to 3 parts by weight relative to 100 parts by weight of the curable resin. When the content of the cationic photopolymerization initiator is excessively low, curing may not be sufficiently performed, and when the content of the cationic photopolymerization initiator is excessively high, the content of the ionic material is increased after curing, thereby degrading durability of the adhesive, or degrading optical durability of the adhesive because of the characteristic of the initiator. In addition, depending on a base, corrosion may occur, and in consideration of this, a suitable content range may be selected.

The curable adhesive layer may further include a high molecular weight resin. When the composition is molded in a film or sheet shape, the high molecular weight resin serves to improve moldability. In addition, the high molecular weight resin may serve as a high-temperature viscosity controller to control flowability in the process.

The kind of high molecular weight resin that can be used in the present invention is not particularly limited as long as the resin has compatibility with another component such as the curable resin. A specific kind of high molecular weight resin that can be used may be, but is not limited to, a resin having a weight average molecular weight of 20,000 or more, which is one or a mixture of at least two of a phenoxy resin, an acrylate resin, a high molecular weight epoxy resin, an ultra-high molecular weight epoxy resin, a rubber containing a high polarity functional group, and a reactive rubber containing a high polarity functional group, but the present invention is not limited thereto.

When the high molecular weight resin is included in the curable adhesive layer, the content is controlled according to a desired physical property, and is not particularly limited. For example, the high molecular weight resin may be included in an amount of approximately 200 parts by weight, 150 parts by weight, or 100 parts by weight or less relative to 100 parts by weight of the curable resin. As the content of a binder resin is controlled to 200 parts by weight or less, the compatibility with each component of the resin composition may be effectively maintained, and the high molecular weight resin may also serve as an adhesive.

The adhesive film may further include an additive such as an additional filler to enhance durability of the cured product, a coupling agent to enhance mechanical strength and adhesive strength, a plasticizer, a UV stabilizer and an antioxidant without an influence on the effects of the present invention.

The curable adhesive layer of the adhesive film may have a single-layered structure, or a multi-layered structure having at least two adhesive layers. When the adhesive film includes multi-layered adhesive layers, more of the moisture absorbent may be contained in layers farther from the organic electronic device.

The structure of the adhesive film of the present invention is not particularly limited as long as the adhesive film includes the adhesive layer. For example, the adhesive film may have a structure including a base or releasing film (hereinafter referred to as a "first film"); and the adhesive layer formed on the base or releasing film.

The adhesive film may further include a base or releasing film (hereinafter referred to as a "second film") which is formed on the adhesive layer.

A specific kind of the first film that can be used in the present invention is not particularly limited. In the present invention, as the first film, for example, a general polymer film in the art may be used. In the present invention, for example, as the base or releasing film, a polyethylene terephthalate film, a polytetrafluoroethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film may be used. In addition, suitable releasing treatment may be performed on one or both surfaces of the base or releasing film of the present invention. An example of a releasing agent used in the releasing treatment of the base film may be an alkyde-based agent, silicon-based agent, fluorine-based agent, fluorinated ester-based agent, polyolefin-based agent or wax-based agent, and among these, in terms of heat resistance, an alkyde-based agent, silicon-based agent or fluorine-based releasing agent is preferably used, but the present invention is not limited thereto.

In addition, the kind of the second film (hereinafter, also referred to as a "cover film") that can be used in the present invention is not particularly limited, either. For example, in the present invention, as the second film, in the above-described range of the first film, one that is the same as or different from the first film may be used. In addition, in the present invention, suitable releasing treatment may also be performed on the second film.

A thickness of the base or releasing film as described above (the first film) is not particularly limited, and may be suitably selected according to application. For example, in the present invention, the thickness of the first film may be approximately 10 to 500 µm or 20 to 200 µm. When the thickness of the film is controlled within the above range, transformation of the base film may be prevented, and economic feasibility may be increased.

A thickness of the second film is not particularly limited either. In the present invention, for example, the thickness of the second film may be set to be the same as that of the first film. In addition, in consideration of processability, the thickness of the second film may be set to be relatively smaller than that of the first film.

A thickness of the adhesive layer included in the adhesive film is not particularly limited, and in consideration of a use of the film, the thickness of the adhesive layer may be suitably selected according to the following conditions.

In exemplary embodiments of the present invention, a method of manufacturing the adhesive film described above is not particularly limited. For example, the adhesive film may be manufactured by coating a coating solution including a composition of the above-described adhesive layer on a base or releasing film (first operation); or drying the coating solution coated in the first operation (second operation).

In the method of manufacturing the adhesive film according to the present invention, a third operation of compressing a base or releasing film on the coating solution dried in the second operation may be further included.

The first operation is to prepare a coating solution by dissolving or dispersing a composition of the above-described adhesive layer in a suitable solvent. In this operation, a content of the epoxy resin included in the coating solution may be suitably controlled according to desired moisture resistance and film moldability.

The kind of the solvent used in the preparation of the coating solution is not particularly limited. However, when a drying time of the solvent is excessively long, or drying of the solvent at a high temperature is necessary, problems in terms of workability or durability of the adhesive film may occur, and thus it is preferable that a solvent having a volatile temperature of 100° C. or less be used. In addition, in consideration of the film moldability, a small amount of a solvent having a volatile temperature beyond the above range may be mixed. As an example of the solvent that can be used in exemplary embodiments of the present invention, one or a mixture of at least two of methylethylketone (MEK), acetone, toluene, dimethylformamide (DMF), methylcellosolve (MCS), tetrahydrofuran (THF) and N-methylpyrollidone (NMP) can be used.

In the first operation, a method of coating the coating solution on the base or releasing film is not particularly limited, and a known method such as knife coating, roll coating, spray coating, gravure coating, curtain coating, comma coating or lip coating may be used without limitation.

The second operation is to form an adhesive layer by drying the coating solution coated in the first operation. That is, in the second operation, the adhesive layer may be formed by drying and removing a solvent by heating the coating solution coated on the film. Here, a drying condition is not particularly limited, and the drying may be performed at 70 to 200° C. for 1 to 10 minutes.

In the method of manufacturing the adhesive film, a third operation of compressing another base or releasing film on the adhesive layer formed on the film may be further included after the second operation.

The third operation described above may be performed by compressing another releasing or base film (cover film or second film) on the dried adhesive layer by a hot roll laminating or pressing process, after coating the adhesive layer. Here, the third operation may be performed by hot roll lamination in terms of probability and efficiency of a continuous process, and here, the process may be performed at approximately 10 to 100° C., and a pressure of approximately 0.1 to 10 kgf/cm$^2$.

Another exemplary embodiment of the present invention provides an organic electronic device encapsulation product, which includes: a substrate; an organic electronic device formed on the substrate; and the above-described adhesive film encapsulating the organic electronic device, in which the adhesive film covers an entire surface of the organic electronic device.

The organic electronic device encapsulation product may further include a protective layer to protect the organic electronic device between the adhesive film and the organic electronic device.

The organic electronic device encapsulation product may further include an encapsulation substrate above the adhesive film, and here, the adhesive film serves to adhere the encapsulation substrate to the substrate. In one exemplary embodiment of the present invention, the organic electronic device may be an organic light emitting diode.

The organic electronic device encapsulation product has advantages of a simple process and a decrease in production cost. The organic electronic device encapsulation product can also be used regardless of a method of designing the organic electronic device, and provide excellent mechanical durability to the organic electronic device.

Still another exemplary embodiment of the present invention provides a method of encapsulating an organic electronic device, which includes applying an adhesive layer of the above-described adhesive film to a substrate on which an organic electronic device is formed to cover an entire surface of the organic electronic device, and curing the adhesive layer.

The application of the adhesive film to the organic electronic device may be performed by hot-roll lamination, hot pressing or vacuum compression of the adhesive film, but the present invention is not particularly limited.

The application of the adhesive film to the organic electronic device may be performed at 50 to 90° C., and the curing operation may be performed by heating in a range of 70 to 110° C., or radiating UV rays.

In addition, the method may further include attaching the adhesive film to face an additional encapsulation material such as glass or metal.

The method of encapsulating an organic electronic device includes forming a transparent electrode on a substrate such as glass or a polymer film by a method such as vacuum deposition or sputtering, and forming an organic material layer on the transparent electrode. The organic material layer may include a hole injection layer, a hole transport layer, an emitting layer, an electron injection layer and/or an electron transport layer. Subsequently, a second electrode is further formed on the organic material layer. Afterward, the above-described adhesive film is applied to a top surface of the organic electronic device on the substrate to cover an entire surface of the organic electronic device. Here, a method of applying the adhesive film is not particularly limited, and may be a method of heating or compressing a cover substrate (e.g., glass or a polymer film) to which the above-described adhesive layer of the adhesive film is previously transfer-printed to a top surface of the organic electronic device formed on the substrate. In this operation, for example, when the adhesive film is transfer-printed on the cover substrate, the above-described adhesive film may be transfer-printed on the cover substrate using a vacuum press or vacuum laminator by applying heat after a base or releasing film formed on the film is peeled off. In this operation, when a curing reaction of the adhesive film is performed in a certain range or more, cohesive strength or adhesive strength of the adhesive film may be decreased, thereby controlling a process temperature and a process time to approximately 100° C. and approximately 5 minutes, respectively. Similarly, even when the cover substrate on which the adhesive film is transfer-printed is heat-compressed to the organic electronic device, a vacuum press or vacuum laminator may be used. A temperature condition for this operation may be set as described above, and a process time may be within 10 minutes.

In addition, an additional curing process to the adhesive film to which the organic electronic device is compressed may be performed, and such a curing process (main curing) may be performed, for example, in a heating chamber or UV chamber. A curing condition in the main curing may be suitably selected in consideration of stability of the organic electronic device.

However, the above-described forming process is merely an example for encapsulating the organic electronic device, and thus a sequence of or condition for the process may be freely changed. For example, the sequence of the transfer-printing and compressing processes may be changed in such a manner that the above-described adhesive film is transfer-printed to the organic electronic device on the substrate, followed by compressing the cover substrate. In addition, after the protective layer is formed on the organic electronic device, the adhesive film is applied and then cured without the cover substrate.

Hereinafter, the present invention will be described in further detail with reference to Examples according to the present invention and Comparative Examples not according to the present invention, but the scope of the present invention is not limited to the following Examples.

Examples 1 to 3

1. Preparation of Adhesive Solution

A moisture absorbent solution was prepared by putting 70 g of CaO (Aldrich) as a moisture absorbent into methylethylketone at a concentration of 30 wt %, and milled by a ball-mill process for 24 hours. In addition, separately, 200 g of a silane-modified epoxy resin (KSR-177, Kukdo Chemical Co., Ltd.) and 150 g of a phenoxy resin (YP-50, Tohto Kasei Co., Ltd.) were put into a reaction vessel at room temperature, and diluted with methylethylketone. Afterward, an inside of the reaction vessel was replaced with nitrogen, and the prepared solution was homogenized. The moisture absorbent solution prepared beforehand was put into the homogenized solution, 4 g of an imidazole (Shikoku Chemicals Co., Ltd.) was added as a curing agent, and the resulting solution was stirred at a high speed for 1 hour, thereby preparing an adhesive solution.

2. Formation of Adhesive Film

An adhesive layer having a thickness of 15 μm was formed by coating the above-prepared adhesive solution to a releasing surface of a releasing PET using a comma coater, and drying the resulting surface with a drier at 130° C. for 3 minutes, and the releasing PET was further compressed to a top surface of the adhesive layer.

3. Storage of Adhesive Film

The above-prepared adhesive film was kept in a freezer at a temperature of −5° C. for 2, 4 and 8 weeks.

Comparative Examples 1 to 3

Adhesive films were prepared by the same method as described in Examples 1 to 3, except that they were kept in a freezer at 4° C. in the storage of the adhesive film of Example 1.

Experimental Example 1: Confirmation of Moisture Resistance

A calcium test was executed to investigate moisture resistance of the adhesive film in each of Examples 1 to 3 and Comparative Examples 1 to 3. Particularly, 9 spots of calcium (Ca) were deposited to a size of 5 mm×5 mm and a thickness of 100 nm on a glass substrate having a size of 100 mm×100 mm, and a cover glass to which the adhesive film of each of Examples 1 to 3 and Comparative Examples 1 to 3 was transfer-printed was heat-compressed to each calcium-deposited spot at 80° C. for 1 minute using a vacuum press. Afterward, the resulting product was cured in a high-temperature drier at 100° C. for 3 hours, and an encapsulated calcium specimen was cut into a size of 11 mm×11 mm. The obtained specimens were left in an environment including a temperature of 85° C. and R.H. of 85% in a constant temperature and constant humidity chamber, and a point at which calcium started to become transparent by an oxidation reaction due to permeation of moisture was evaluated. The results are shown in Tables 1 and 2.

TABLE 1

| Category | Example 1 | Example 2 | Example 3 |
| --- | --- | --- | --- |
| Time at which transparency was exhibited (h) | 900 h | 900 h | 895 h |
| Moisture permeation speed (μm/hr) | 6.66 | 6.66 | 6.70 |
| | Comparative Example 1 | Comparative Example 2 | Comparative Example 3 |
| Time at which transparency was exhibited (h) | 850 h | 820 h | 750 h |
| Moisture permeation speed (μm/hr) | 7.05 | 7.41 | 8.00 |

Experimental Example 2: Measurement of Temporal Change in Weight Increase Ratio

Weight increase ratios of the adhesive films of Examples 1 to 3 and Comparative Examples 1 to 3 were investigated. Particularly, the adhesive films of Examples 1 to 3 and Comparative Examples 1 to 3 were prepared to a thickness of 200 μm, cured in a high temperature drier at 100° C. for 3 hours, and cut to a size of 5 cm×5 cm, thereby preparing a sample. An initial weight of the cured sample was recorded, the sample was left in a constant temperature and constant humidity chamber at 85° C. and R.H. of 85% for 24 hours, moisture was removed from a surface of the sample, and a weight of the sample was measured. The weight increase ratio of the sample was calculated by the following equation, and is shown in Table 2.

Weight increase ratio (%)=(B−A)/A×100

In the above equation, B is a weight of the sample after moisture was absorbed, and A is an initial weight of the sample.

TABLE 2

| Category | Example 1 | Example 2 | Example 3 |
| --- | --- | --- | --- |
| Weight increase ratio (%) | 3.72 | 3.72 | 3.71 |
| | Comparative Example 1 | Comparative Example 2 | Comparative Example 3 |
| Weight increase ratio (%) | 3.65 | 3.51 | 3.27 |

Figure 1:
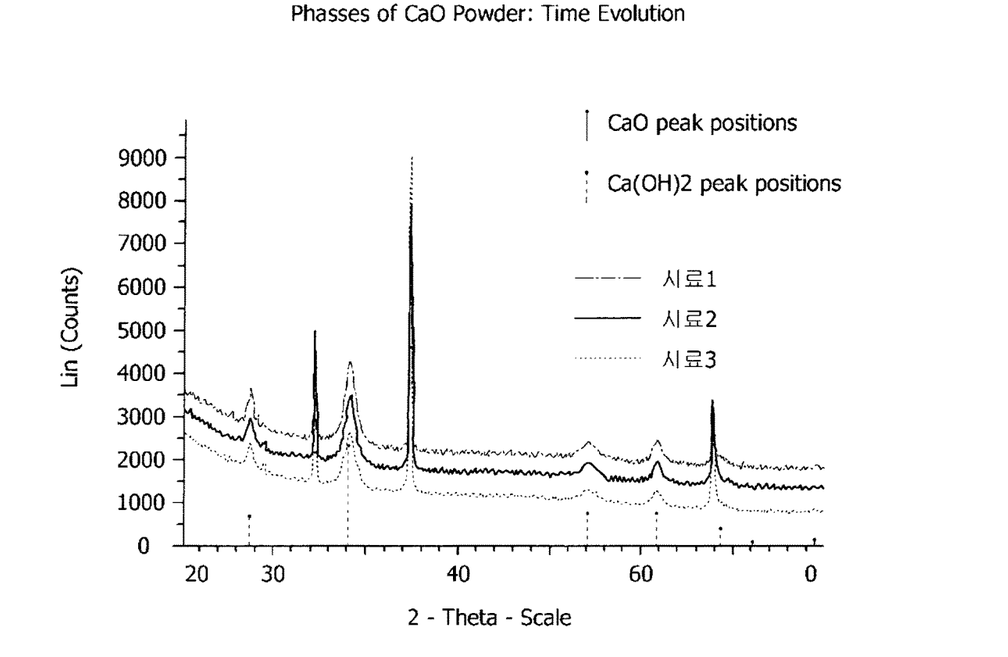
FIG. 1 is an XRD graph showing temporal change of a moisture absorbent of an adhesive film according to Examples and Comparative Examples of the present invention.

Experimental Example 3: Measurement of Temporal Change in Purity of Moisture Absorbent To measure change in moisture resistance before and after storage of the adhesive films in Examples 1 to 3 and Comparative Examples 1 to 3, change in purity of the moisture absorbent (CaO) in the adhesive film was measured by X-ray diffraction (XRD). Particularly, XRDs of a 100-degree region were each measured by change in angle of at 0.019 degrees for 175 seconds at the characteristic value of the CaO, that is, 2 theta 10 degrees, under conditions of a voltage of 40 kV, a current of 40 mA, and a wavelength of CuKα radiation of 1.5418 using an XRD apparatus ((Bruker AXS D4 Endeavor XRD (2)), and are shown in FIG. 1. Referring to FIG. 1, $Ca(OH)_2$ had different ratios after a moisture reaction with the CaO. To measure the change in purity of the CaO of each adhesive film, Rietveld refinement was performed, and a weight ratio (wt %) between the CaO and the $Ca(OH)_2$ was calculated, which is shown in Table 3.

TABLE 3

| Category | Example 1 | Example 2 | Example 3 |
| --- | --- | --- | --- |
| $CaO/Ca(OH)_2$ (wt %) | 96.0 | 96.0 | 95.7 |
| | Comparative Example 1 | Comparative Example 2 | Comparative Example 3 |
| $CaO/Ca(OH)_2$ (wt %) | 87.5 | 80.1 | 74.5 |

As shown above, it can be confirmed that the adhesive films in Examples 1 to 3 according to exemplary embodiments of the present invention had the temporal change in the purity of the moisture absorbent as stored at 0° C. or less of less than 10%, the temporal change in weight increase ratio under durability conditions of 0.2%, and the temporal change in moisture resistance of less than 1%, and thus the adhesive films effectively encapsulated the organic electronic device from moisture. However, like the conventional adhesive film, it can be confirmed that an adhesive film stored at a refrigeration temperature of 4° C. had a greater temporal change in moisture resistance as storage time became longer compared to initial moisture resistance.

While the invention has been shown and described with reference to certain exemplary embodiments thereof, it will be understood by those skilled in the art that various changes in form and details may be made therein without departing from the scope of the invention as defined by the appended claims.

What is claimed is:

1. A method of manufacturing an adhesive film encapsulating an organic electronic device, comprising:
providing a curable adhesive layer which comprises a curable resin and a moisture absorbent, and a base or releasing film which is positioned on both surfaces of the curable adhesive layer, and forming the adhesive film; and
storing the adhesive film at −10° C. to 0° C.,
wherein the adhesive film has a temporal change in moisture resistance of less than 1%, and the adhesive film satisfies at least one of the following three conditions:
  a) a temporal change in purity of the moisture absorbent of less than 10 wt %;
  b) a temporal change in weight increase ratio under a durability condition of a temperature of 85° C. and a relative humidity of 85% of less than 0.2%; and
  c) a temporal change in moisture permeating speed of less than 10%, and
wherein contents of the moisture absorbent and a hydration product of the moisture absorbent satisfy Equation 1:

$$X/X_0 \geq 90 \text{ wt \%} \qquad \text{[Equation 1]}$$

where X is a weight of the moisture absorbent, and $X_0$ is a product produced by hydrating the moisture absorbent with water.

2. The method according to claim 1, wherein the curable adhesive layer has a viscosity at room temperature of $10^6$ dyne/cm² or more.

3. The method according to claim 1, wherein the curable resin has a water vapor transmission rate (WVTR) in a cured state of 50 g/m²·day or less.

4. The method according to claim 1, wherein the curable resin is a heat-curable resin, a photocurable resin, or a dual-curable resin.

5. The method according to claim 1, wherein the curable resin comprises at least one curable functional group selected from a glycidyl group, an isocyanate group, a hydroxyl group, a carboxyl group, an amide group, an epoxide group, a cyclic ether group, a sulfide group, an acetal group, and a lactone group.

6. The method according to claim 1, wherein the curable resin is an epoxy resin comprising a cyclic structure in a molecular structure.

7. The method according to claim 1, wherein the moisture absorbent is alumina, a metal oxide, a metal salt, or phosphorus pentoxide.

8. The method according to claim 7, wherein the moisture absorbent is at least one selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

9. The method according to claim 1, wherein the adhesive layer comprises the moisture absorbent in an amount of 1 to 100 parts by weight relative to 100 parts by weight of the curable resin.

10. The method according to claim 1, wherein the adhesive layer further comprises a filler.

11. The method according to claim 10, wherein the filler is at least one selected from the group consisting of clay, talc, silica, zeolite, zirconia, titania and montmorillonite.

12. The method according to claim 10, wherein the adhesive layer comprises the filler in an amount of 1 to 50 parts by weight relative to 100 parts by weight of the curable resin.

13. The method according to claim 1, wherein the adhesive layer further comprises a curing agent.

14. The method according to claim 13, wherein the curing agent is an amine-based compound, imidazole-based compound, phenol-based compound, phosphorus-based compound, or acid-anhydride-based compound.

15. The method according to claim 13, wherein the adhesive layer comprises the curing agent in an amount of 1 to 10 parts by weight relative to 100 parts by weight of the curable resin.

16. The method according to claim 1, wherein the adhesive layer further comprises an initiator.

17. The method according to claim 1, wherein the adhesive layer further comprises a high molecular weight resin.

18. The method according to claim 1, wherein the curable adhesive layer has a single layered structure or a multilayered structure having at least two layers or more.

* * * * *